United States Patent [19]

Yry

[11] Patent Number: 5,189,677
[45] Date of Patent: Feb. 23, 1993

[54] ARRANGEMENT HAVING TWO LASER DIODES FOR GENERATING LIGHT HAVING TWO WAVELENGTHS

[75] Inventor: Uwe Yry, Aalen, Fed. Rep. of Germany

[73] Assignee: Carl-Zeiss-Stiftung, Heidenheim, Fed. Rep. of Germany

[21] Appl. No.: 808,221

[22] Filed: Dec. 16, 1991

[30] Foreign Application Priority Data

Dec. 14, 1990 [DE] Fed. Rep. of Germany ....... 4039955

[51] Int. Cl.⁵ .............................................. H01S 3/10
[52] U.S. Cl. ...................................... 372/23; 372/32; 356/349
[58] Field of Search ..................... 372/23, 29, 32; 356/359

[56] References Cited

U.S. PATENT DOCUMENTS

| | | | |
|---|---|---|---|
| 4,821,273 | 4/1989 | Hoozi | 372/32 |
| 4,832,489 | 5/1989 | Wyant et al. | 356/359 |
| 4,930,139 | 5/1990 | Babbit | 372/32 |
| 5,127,731 | 7/1992 | DeGroot | 372/32 |

FOREIGN PATENT DOCUMENTS

| | | |
|---|---|---|
| 1-298782 | 12/1989 | Japan . |
| 2-077630 | 3/1990 | Japan . |
| WO87/01874 | 3/1987 | World Int. Prop. O. . |

OTHER PUBLICATIONS

DenBoer, "Two-Wavelength Scanning Spot Interferometer Lasing Single Frequency Diode Lasers"; Appl Opt vol. 27(2); 15 Jan. 15, 1988.

"Laser frequency stabilization for high bit-rate FSK multichannel coherent systems", by P. Gambini et al, 10415 CSELT Technical Papers, vol. 17, No. 1, Feb. 1989, New York, United States.

"Stabilization of Oscillation Frequency of an AlGaAs/GaAs Ridge Waveguide Distributed Feedback Laser", by M. Kameya et al, Electronics Letters, vol. 23, No. 5, Feb. 26, 1987, United Kingdom.

"An Allan Variance Real-Time Processing System for Frequency Stabiity Measurements of Semiconductor Lasers", by K. Kuboki et al, IEEE Transactions on Instrumentation and Measurement, vol. 39, No. 4, Aug. 1990, New York U.S.

"Frequency Stabilisation of AlGaAs Lasers to Absorption Spectrum of Rubidium Using Zeeman Effect" by R. A. Valenzuela et al, Electronics Letters, vol. 24, No. 12, Jun. 9, 1988, pp. 725 to 726.

Primary Examiner—Léon Scott, Jr.
Attorney, Agent, or Firm—Walter Ottesen

[57] ABSTRACT

The wavelength difference of two laser diodes is stabilized on a single Fabry-Perot interferometer. This stabilization is of such a quality that the application in the two-wavelength interferometry and two-wavelength holography is possible. In the Fabry-Perot interferometer, the light components may be distinguished by their polarization or may be spatially separated.

6 Claims, 2 Drawing Sheets

ARRANGEMENT HAVING TWO LASER DIODES FOR GENERATING LIGHT HAVING TWO WAVELENGTHS

FIELD OF THE INVENTION

The invention relates to an arrangement having two laser diodes for generating light having two wavelengths with stabilized wavelength difference.

BACKGROUND OF THE INVENTION

An arrangement of the kind referred to above is known as a two-frequency laser interferometer and is disclosed in German patent application 3,616,393. The stabilization takes place by means of mechanical, thermal and electrical coupling of the two laser diodes to each other. Especially the long-term wavelength changes of laser diodes limit the quality that can be obtained therewith.

The stabilization of an individual laser diode by means of a Fabry-Perot interferometer is known and reliable.

The paper of R. A. Valenzuela et al entitled "Frequency Stabilization of AlGaAs Lasers to Absorption Spectrum of Rubidium using Zeeman Effect", Electronics Letters, Vol. 24, No. 12, June 9, 1988, pages 725 and 726, discloses the stabilization of a Fabry-Perot interferometer to an optical reference and the stabilization of a further light source to this Fabry-Perot interferometer. Here, a Fabry-Perot interferometer is driven with two light sources but only one type of light, namely, that of the laser diode is made available as a use light.

SUMMARY OF THE INVENTION

It is an object of the invention to provide an arrangement which, with respect to stability, satisfies the requirements of the two-wavelength laser interferometry and two-wavelength holography and which simultaneously limits the complexity of the configuration.

In several measuring problems, two-wavelength interferometry or two-wavelength holography are shown to be effective solutions. Among these are, for example:
  (a) Interferometric measurements wherein the wavelength or visible light is too small for a definite measurement result, for example, absolute interferometric measurement at greater distances.
  (b) Interferometric measurements on surfaces having a roughness comparable to the wavelength or a wavelength greater than the roughness. In this case, the occurring speckle effect makes a measurement with an individual wavelength very difficult or even impossible. However, definitive measurements are possible with two wavelengths.
  (c) Two-wavelength holography can be utilized in the measurement of the contour of large objects.

The methods utilized in the individual cases are very different with respect to their detail. However, what they do have in common is the following basic principle.

To measure an optical path difference (z), the difference is measured interferometrically with a wavelength $\lambda_i$ (i=1,2) and the phase therefore is determined with equation (1) below.

$$\Phi_i = \frac{2\pi}{\lambda_i}(z) \tag{1}$$

If the phase $\phi_1$ and $\phi_2$ are subtracted from each other, the phase difference, $\phi$, is obtained as shown in equation (2).

$$\Phi = \Phi_2 - \Phi_1 = \frac{2\pi}{\Lambda}(z) \tag{2}$$

Wherein:

$$\Lambda = \frac{\lambda_1 \lambda_2}{\lambda_1 - \lambda_2} \tag{3}$$

is the so-called effective or synthetic wavelength. An interferogram is obtained by considering $\phi$ which appears to be taken up with the wavelength $\Lambda$ having a magnitude which can be varied by appropriate selection of $\lambda_1$ and $\lambda_2$ within very wide limits (few $\mu$m to several meters).

The difference formation noted in equation (2) is explicitly carried out in several methods; whereas, in other methods such as for two-wavelength holography, the difference is implicitly contained.

To generate the two wavelengths, the possibility is afforded of using two lasers which generate the different wavelengths. What is critical in this method is the stability of the two wavelengths as can be seen from the following computation.

For computing the optical path difference (z) from a measured $\phi$, equation (2) is inverted and $\Lambda$ is substituted with the value $\Lambda_O$ computed from the desired values of the two wavelengths.

$$z = \Lambda_0 \cdot \frac{\Phi}{2\pi} \tag{4}$$

$\Lambda_O$ is here therefore a constant factor. If the two wavelengths $\lambda_i$ depart from their desired values by $d\lambda_i$, then the actual value of $\Lambda$ likewise changes and therefore also the measured value $\phi$. By substituting equations (2) and (3) into equation (4) and forming the complete differential, the following results:

$$\frac{dz}{\Lambda_0} = \frac{z\, d\lambda_1}{\lambda_1 \lambda_1} - \frac{z\, d\lambda_2}{\lambda_2 \lambda_2} \tag{5}$$

For interpreting this equation, the error dz on the left side is referred to the effective wavelength $\Lambda_O$. This expression must be significantly less than 1 in order to make useful measurements possible. The relative wavelength stabilities are on the right side and are multiplied by the optical path difference (z) which is to be measured in units of the particular wavelength. An example will make this clear. If an optical path difference of 1 m is to be measured with a wavelength of 1 $\mu$m, then the relative wavelength stability therefore must be $< 10^{-6}$ if only one wavelength is considered in equation (5) and 1 is on the left side. In practice, in the given example, the wavelengths must therefore have a stability greater than $10^{-7}$ independently of the selected effective wavelength.

This stability is obtained in the known manner for one wavelength by means of a Fabry-Perot interferometer.

According to the invention, the stabilization of two laser diodes is carried out with only one Fabry-Perot interferometer. The complexity for the Fabry-Perot interferometer is therefore only required once and the residual error influences are the same for both wavelengths.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
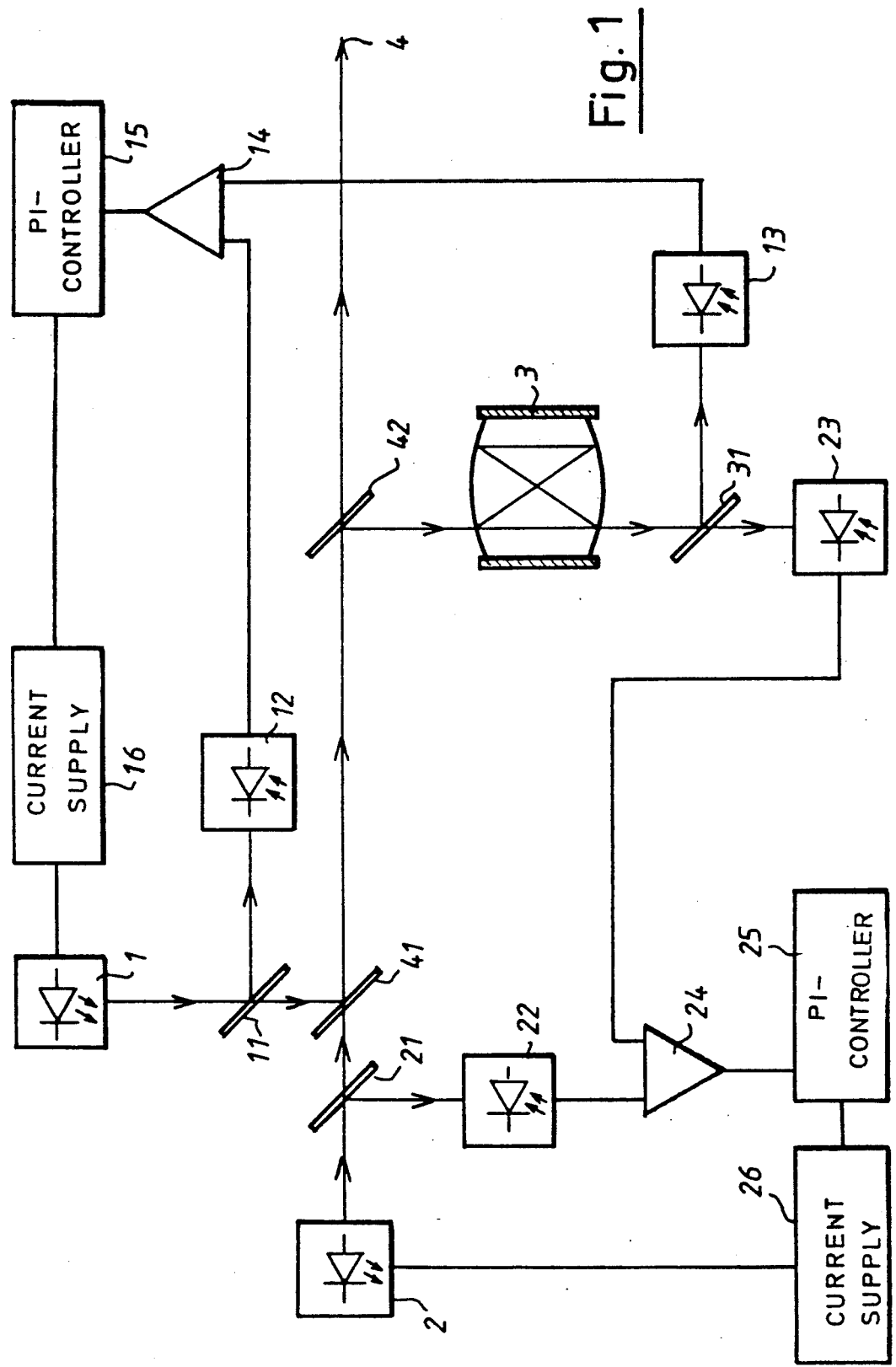
FIG. 1 is a schematic block diagram of an arrangement according to the invention including polarization identification, confocal Fabry-Perot interferometer and flank stabilization with the aid of reference photodiodes; and, FIG. 2 is a block diagram of a second embodiment of the arrangement according to the invention having spatially separated beam paths, a plane-parallel Fabry-Perot interferometer and maximum stabilization pursuant to the lock-in method.

In FIG. 1, two temperature-stabilized laser diodes (1, 2), a confocal Fabry-Perot interferometer 3 and the light beam 4 emanating from the arrangement are shown. Respective components of the beams of the two laser diodes (1, 2) are directed via respective divider mirrors (11, 21) to reference photodiodes (12, 22). The respective other components of light of the two laser diodes (1, 2) are linearly polarized orthogonally to each other by a polarizing divider mirror 41 and joined into one beam. From this one beam, a beam splitter 42 splits off a secondary beam and the primary component is available for use as an output beam 4.

The secondary component split off at beam splitter 42 is coupled into the confocal Fabry-Perot interferometer 3. The light emanating from the Fabry-Perot interferometer 3 is split into the components coming from the luminescent diodes (1, 2) by a polarizing beam splitter 31. These light components are detected by photodetectors (13, 23), respectively.

The signals of the photodetector 13 are supplied with the signals of the reference photodiode 12 to a differential amplifier 14 which drives a PI-controller 15, which, in turn, acts on the current supply 16 of the laser idode 1.

With this control circuit, the wavelength of the laser diode 1 is controlled and stabilized to a specific value on the flank of the Nth transmittance maximum of the Fabry-Perot interferometer 3.

The wavelength of the second laser diode 2 is controlled in the same manner by means of photodetector 23, reference photodiode 22, differential amplifier 24, PI-controller 25 and current supply 26 but to a different transmittance maximum $N+\Delta N$. The effective wavelength formed wavelengths is:

$$\Lambda_0 = \frac{L}{\Delta N} \quad (6)$$

wherein L is the optical path of a loop through the Fabry-Perot interferometer. $\Lambda_O$ can be thereby varied within wide limits by a suitable selection of L and $\Delta N$.

By means of a suitable construction of the optical components (especially of the free spectral range and the finesse of the Fabry-Perot interferometer) and the control electronics, the two wavelengths can be very well stabilized to a Fabry-Perot interferometer transmittance (for example with relative wavelength deviations of $10^{-8}$ or less). In this way, measuring ranges of several meters are possible. The measuring uncertainty relative to (z) is dependent upon the selected effective wavelength ($\Lambda_O$).

The stability of the position of the transmittance maxima is itself especially influenced by a change of the optical path L of a round-trip pass through the Fabry-Perot interferometer as a consequence of temperature variations.

The following applies:

$$\frac{dz}{\Lambda_0} = \frac{dz\, dL}{\Lambda_0\, L} \quad (7)$$

If a Fabry-Perot interferometer is used with a spacer between the mirrors made of Zerodur (temperature expansion $< 10^{-7}/K$) and if the temperature of the interferometer is stabilized to remain constant at 1° C. or, more specifically, if this temperature is measured with the corresponding precision and its influence on the effective wavelength is considered, then purposeful measurements over a large measuring range even with small effective wavelengths are possible since dL in equation (7) represents only the part of the thermal expansion which has not been considered.

Figure 2:
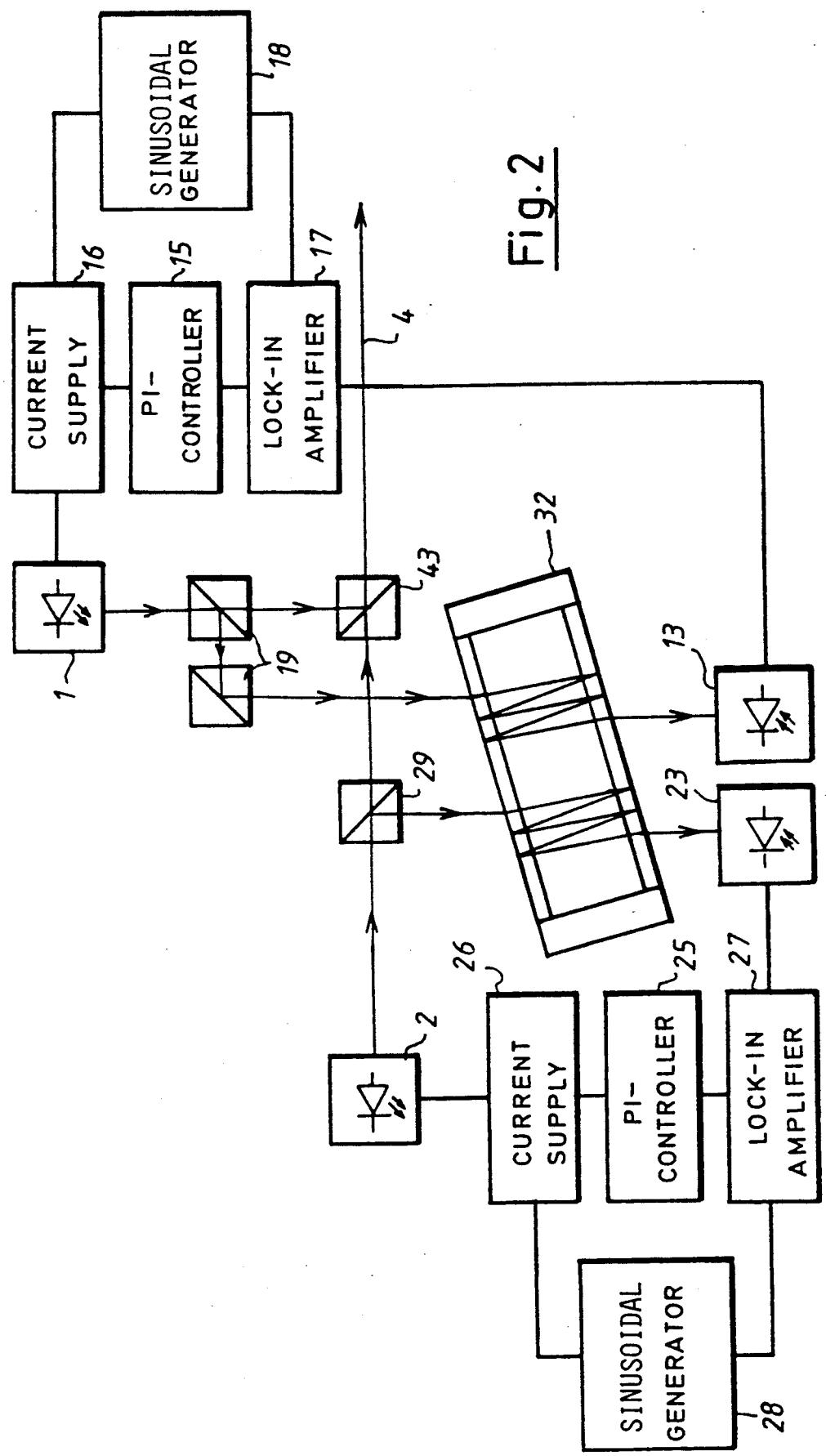

An alternative arrangement is shown in FIG. 2 and this embodiment will now be described.

Light from the two laser diodes (1, 2) is joined by a partially-transmittant mirror 43 and is made available as the emanating light beam 4.

By means of the mirror arrangement 19 and the divider mirror 29, respective components of the light of the two laser diodes (1, 2) are conducted along separate paths to the Fabry-Perot interferometer shown here as having a plane-parallel configuration. In this case, the light emanates separately and is separately detected by mutually adjacent photodiodes (13, 23). The control to a maximum of the transmittance of the Fabry-Perot interferometer 32 takes place according to the lock-in method by means of lock-in amplifier 17, PI-controller 15 and current supply 16 having the modulation frequency of a sinusoidal generator 18 for the first laser diode 1. Correspondingly, lock-in amplifier 27, PI-controller 25, current supply 26 and sinusoidal generator 28 are assigned to second laser diode 2.

The type of beam splitting (polarization or geometric), the configuration of the Fabry-Perot interferometer (confocal 3 or plane parallel 32) and the nature of the control (flank control or maximum control) can be combined in any desired manner. The embodiments shown in the drawings are simply examples.

With the geometric separation of the light and also in combination with the polarization identification, the arrangement can be realized with only one Fabry-Perot interferometer several times in combinations so that, in effect, three and more wavelengths can be joined with common stabilization in the emanating light beam 4.

It is understood that the foregoing description is that of the preferred embodiments of the invention and that various changes and modifications may be made thereto without departing from the spirit and scope of the invention as defined in the appended claims.

What is claimed is:

1. An arrangement for generating light having two wavelengths, the arrangement comprising:

first and second laser diodes for generating first and second beams of light having respective wavelengths;

polarizing means for polarizing said first and second beams relative to each other and superposing said first and second beams into one beam;

splitter means for splitting off respective primary components and respective secondary components from said one beam;

a Fabry-Perot interferometer having first and second transmission maxima;

optical means for coupling respective first portions of said primary components defining said one beam into said interferometer;

first and second photodiodes arranged downstream of said interferometer for receiving said first portions, respectively;

first control means for coacting with said first photodiode and said first secondary component for stabilizing said first laser diode on said first transmission maximum;

second control means for coacting with said second photodiode and said second secondary component for stabilizing said second laser diode on said second transmission maximum; and, said optical means being adapted to supply respective second portions of said primary components not coupled into said interferometer as the output of said arrangement.

2. The arrangement of claim 1, said polarizing means being a polarizing divider mirror for superposing said primary components into said one beam while simultaneously causing said primary components to be differently linearly polarized; said optical means being a beam splitter for coupling said first portions of said primary components into said interferometer and for passing said second portions of said primary components as said output of said arrangement; and further comprising a divider mirror interposed between said interferometer and said first and second photodiodes for splitting off said first portion of said primary component of said first beam into the first photodiode and for passing said first portion of said primary component of said second beam into said second photodiode.

3. The arrangement of claim 1, said Fabry-Perot interferometer being confocal.

4. The arrangement of claim 1, further comprising first and second divider mirrors in the respective light paths between the first and the second laser diode and the polarizing means separating respective third components from said first and second laser diodes and comprising first and second reference diodes for receiving said third components from said first and second laser diodes; and, said first and second control means being adapted to utilize the outputs of said reference diodes, respectively, for flank stabilization.

5. An arrangement for generating light having two wavelengths, the arrangement comprising:

first and second laser diodes for generating first and second beams of light having respective wavelengths;

splitter means for splitting off respective primary components from said first and second beams and respective secondary components from said first and second beams;

a Fabry-Perot interferometer having first and second transmittance maxima and being disposed downstream of said splitter means for separately receiving said primary components;

first and second photodiodes arranged downstream of said interferometer for receiving said primary components, respectively;

first control means for coacting with said first photodiode for stabilizing said first laser diode on said first transmittance maximum;

second control means for coacting with said second photodiode for stabilizing said second laser diode on said second transmittance maximum; and, optical means for receiving said secondary components as the output of said arrangement.

6. The arrangement of claim 5, said splitter means being adapted to pass said primary components along mutually parallel optical axes so as to cause said primary components to be coupled into and out of said interferometer in parallel spaced relationship to each other.

* * * * *

UNITED STATES PATENT AND TRADEMARK OFFICE
CERTIFICATE OF CORRECTION

PATENT NO. : 5,189,677
DATED : February 23, 1993
INVENTOR(S) : Uwe Vry

It is certified that error appears in the above-identified patent and that said Letters Patent is hereby corrected as shown below:

On the title page, under "Inventor": delete "Uwe Yry" and substitute -- Uwe Vry -- therefor.

On the title page, under "Other Publications", line 1: delete "DenBoer" and substitute -- DenBoef -- therefor.

On the title page, under "Other Publications", line 3: delete "15" (first occurrence).

On the title page, under "Other Publications", line 13: delete "Stabiity" and substitute -- Stability -- therefor.

In column 2, line 5: delete "phase" and substitute -- phases -- therefor.

In column 2, line 59: delete "$10^{<6}$" and substitute -- $10^{-6}$ -- therefor.

UNITED STATES PATENT AND TRADEMARK OFFICE
CERTIFICATE OF CORRECTION

PATENT NO. : 5,189,677

DATED : February 23, 1993

INVENTOR(S) : Uwe Vry

It is certified that error appears in the above-identified patent and that said Letters Patent is hereby corrected as shown below:

In column 3, line 54: between "formed" and "wavelengths", insert -- from the two --.

Signed and Sealed this

Second Day of November, 1993

Attest:

BRUCE LEHMAN

Attesting Officer     Commissioner of Patents and Trademarks